United States Patent
Garcia et al.

(10) Patent No.: US 11,903,153 B2
(45) Date of Patent: Feb. 13, 2024

(54) DISPLAY ASSEMBLY FOR AN IMAGING DEVICE

(71) Applicant: FICOSA ADAS, S.L.U., Barcelona (ES)

(72) Inventors: Daniel Abad Garcia, Barcelona (ES); Xavier Armengol, Barcelona (ES)

(73) Assignee: Ficosa Adas, S.L.U., Barcelona (ES)

( * ) Notice: Subject to any disclaimer, the term of this patent is extended or adjusted under 35 U.S.C. 154(b) by 376 days.

(21) Appl. No.: 17/383,898

(22) Filed: Jul. 23, 2021

(65) Prior Publication Data

US 2022/0030726 A1 Jan. 27, 2022

(30) Foreign Application Priority Data

Jul. 23, 2020 (EP) .................................... 20382662

(51) Int. Cl.
*H05K 9/00* (2006.01)
*H05K 5/02* (2006.01)
*H05K 7/20* (2006.01)

(52) U.S. Cl.
CPC ......... *H05K 5/0209* (2022.08); *H05K 9/0054* (2013.01); *H05K 7/20418* (2013.01); *H05K 9/0045* (2013.01)

(58) Field of Classification Search
CPC .......................... H05K 9/0054; H05K 9/0037
See application file for complete search history.

(56) References Cited

U.S. PATENT DOCUMENTS

| | | | |
|---|---|---|---|
| 6,049,469 A | 4/2000 | Hood, III et al. | |
| 6,310,767 B1 * | 10/2001 | Spear | G02F 1/133308 345/905 |
| 8,400,607 B2 * | 3/2013 | Cappaert | G02F 1/133385 349/161 |
| 2009/0180048 A1 * | 7/2009 | Kim | H05K 7/20963 264/239 |
| 2011/0063265 A1 * | 3/2011 | Kim | G06F 1/20 361/752 |
| 2017/0111989 A1 * | 4/2017 | Wang | H05K 9/0032 |
| 2018/0098461 A1 | 4/2018 | Matsuno et al. | |
| 2020/0045823 A1 * | 2/2020 | Tomar | H05K 1/162 |
| 2020/0169623 A1 | 5/2020 | Shin | |
| 2021/0022274 A1 * | 1/2021 | Dellock | H05K 7/20854 |
| 2021/0298212 A1 * | 9/2021 | Mayer | H01L 23/3672 |
| 2023/0109316 A1 * | 4/2023 | Jang | H10K 50/844 345/156 |

OTHER PUBLICATIONS

European Search Report dated Jan. 15, 2021 for European Application No. 20382662.3, 5 pgs.

* cited by examiner

*Primary Examiner* — Hung V Ngo
(74) *Attorney, Agent, or Firm* — Brooks Kushman P.C.

(57) ABSTRACT

A display assembly for an imaging device including a display panel, a display, a first control unit, a second control unit and a thermally insulating layer, and a housing. The thermally insulating layer divides the housing in at least a first cavity including the first control unit and a second cavity including the second control unit. The thermally insulating layer preventing heat generated in the first cavity or the second cavity from reaching the other cavity and including an electrically conductive material to at least partially shield electromagnetic radiation generated in the first or the second cavity from reaching the other cavity.

20 Claims, 6 Drawing Sheets

DISPLAY ASSEMBLY FOR AN IMAGING DEVICE

CROSS-REFERENCE TO RELATED APPLICATIONS

This application claims priority to EP application Serial No. 20382662.3 filed Jul. 23, 2020, the disclosure of which is hereby incorporated in its entirety by reference herein.

TECHNICAL FIELD

The present invention relates to an imaging device for a vehicle, specifically a display assembly of the imaging device arranged to be located on a motor vehicle. The display assembly object of the invention improves the drawbacks derived from heat dissipation and from electromagnetic interference among the elements of the device and with other elements of the vehicle.

BACKGROUND

Traditionally, motor vehicles, for instance cars, needed a reflective mirror to allow drivers to see areas behind the vehicle.

Nowadays, some of these mirrors are being replaced by an electronic mirror such as a Camera Monitoring System (CMS). The CMS comprises a camera located on a lateral side of the vehicle pointing out backwardly. The captured image is received by an electronic control unit (ECU), i.e., by the ECU of the CMS, that carries out an image processing.

The ECU of the CMS generates a display image to be shown on a display panel. The display panel is located in the vehicle, normally on the door, but other locations are not ruled out.

The known display panels of the prior art are generally a Liquid Crystal Display (LCD), with an ECU of the display to generate instructions for the display.

It is well known that control units generate heat. Thus, the heat is harmful to the display. At high temperatures, the display may stop working properly and/or its life span is considerably shortened.

Also, it is well known the electromagnetic radiation effect generated by electronic components such as ECUs. The electromagnetic radiation creates a lot of performance issues, and this electromagnetic radiation increases significantly when a device has two or more electronic control units (ECUs).

A second control unit is a control unit configured to carry on at least an operation of image processing, and more preferably, to control the CMS.

A CMS comprises two electronic control units: the first ECU is associated to the display, and the second ECU controls or governs the CMS. The second control unit is also connected to the first control unit for transmitting and/or receiving data to the second control unit.

The first and second ECUs can be located next to each other in a plane parallel to the display panel. Alternatively, in order to save space, both ECUs can be located one after the other, for example, the first control unit being located between the display panel and the second control unit.

The heat generated by the second ECU, i.e., the ECU of the CMS, negatively affects the display panel. A thermally insulating layer, for instance, a plastic frame, is arranged between the display and the second control unit. This plastic frame prevents the heat generated by the second ECU from affecting the display. The thermally insulating layer prevents an increase to the temperature around the display by acting as a thermal insulator.

In the above embodiment, it is well known that plastic materials are good thermal insulators. Therefore, a plastic frame prevents the heat generated by the ECU of the CMS from reaching the display.

It is understood that plastic is a synthetic material made from a wide range of organic polymers such as polyethylene, PVC, nylon, etc., that can be moulded into shape while soft, and then set into a rigid or slightly elastic form.

Therefore, two different technical effects have to be balanced. On the one hand, to isolate the display from the temperature of the second ECU and in turn to avoid EMC due to the use of both PCBs in the same device.

The above known display assembly also comprises a housing. The housing may comprise a first part and a second part to enable the assembly of the electronic components. The housing may be made up of, for instance, a metallic material like aluminum.

SUMMARY

It is the objective of the present invention to reduce the electromagnetic radiations coming out of the display assembly and at the same time allows for the thermal insulation of the elements.

The display assembly or an object of the invention comprises:
 a display panel comprising:
 a display, and
 a first control unit connected to the display for its control,
 a second control unit connected to the first control unit for transmitting and/or receiving data to the second control unit,
 a thermally insulating layer arranged between the first control unit and the second control unit,
 a housing configured for being electrically conductive and configured for partially encasing the first control unit, the second control unit and the thermally insulating layer.

In an embodiment, the edges of the housing surround the edges of the display and thus the first control unit, the second control unit and the thermally insulating layer are encased, i.e., completely surrounded by the housing and the display.

The thermally insulating layer is configured to split the housing in at least a first cavity and a second cavity. Thus, the cavity inside the housing is split into two cavities. The first cavity comprises the first control unit and the second cavity comprises the second control unit. The thermally insulating layer being adapted to prevent heat generated in the first cavity from reaching the second cavity and heat generated in the second cavity from reaching the first cavity.

The thermally insulating layer additionally comprises an electrically conductive material such that the thermally insulating layer is electrically conductive. The thermally insulating layer is adapted to at least partially, i.e., at least not completely, shield electromagnetic radiation generated in the first cavity so as to prevent the electromagnetic radiation from reaching the second cavity and/or at least partially shield electromagnetic radiation generated in the second cavity so as to prevent the electromagnetic radiation from reaching the first cavity.

The above assembly overcomes the previous problems or drawbacks, i.e., high temperatures on the display panel and the EMCs. This may be attributed to the thermally insulating layer additionally comprising an electrically conductive material such that the layer becomes conductive.

As the layer is made conductive, the layer increases the shielding of the second control unit that is encased by the housing, which is already conductive, and by the thermally insulating layer which is made also conductive.

Additionally, as the thermally insulating layer is conductive, the layer allows the first control unit to be shielded by the conductive thermally insulating layer.

A balance between thermal dissipation and EMCs is achieved. The entire thermally insulating layer should not be made up of the conductive material because problems of heat dissipation may appear. On the other hand, if the thermally insulating layer is made up entirely of a thermally insulating material then EMC problems may appear.

BRIEF DESCRIPTION OF THE DRAWINGS

To complete the description and in order to provide for a better understanding of the invention, drawings are provided. The drawings form an integral part of the description and illustrate a preferred embodiment of the invention. The drawings comprise the following figures.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
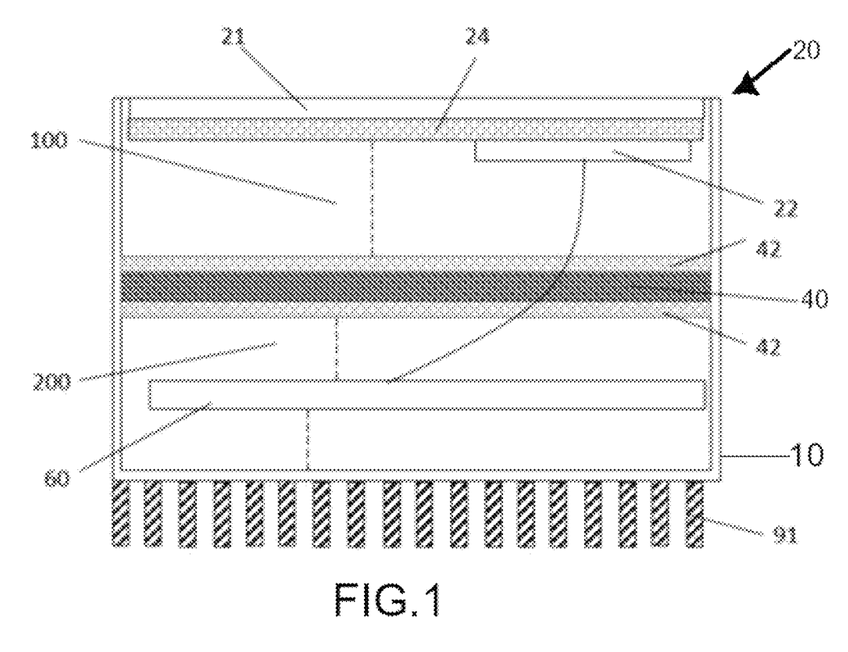
FIG. 1 shows a cross-section of a schematic embodiment of a display assembly.

FIG. 1 disclose a schematic embodiment of the display assembly object of the invention.

The shown display assembly comprises:
a display panel (20) comprising:
a display (21), the display (21) is an OLED display,
a first control unit (22) connected to the display (21) for its control.
a second control unit (60) connected to the first control unit (22) for transmitting and/or receiving data to the second control unit (22),
a thermally insulating layer (40) arranged between the first control unit (22) and the second control unit (60),
a housing (10) configured for being electrically conductive and configured for partially encasing the display panel (20), the second control unit (60) and the thermally insulating layer (40). The housing (10) disclosed in FIG. 1 comprises a U-shape having an open entrance covered by the display (21).

In an embodiment, the edges of the housing (10, 11) surround the edges of the display (21) and thus the first control unit (22), the second control unit (60) and the thermally insulating layer (40) are encased, i.e., completely surrounded by the housing (10, 11) and the display (21).

The thermally insulating layer (40) additionally comprises an electrically conductive material (42) such that the thermally insulating layer (40) is electrically conductive.

The thermally insulating layer (40) is configured to split the interior of the housing (10, 11) in at least the first cavity (100) and the second cavity (200). The first cavity (100) comprising the first control unit (22) and the second cavity (200) comprising the second control unit (60), the thermally insulating layer (40) being adapted to prevent heat generated in the first cavity (100) from reaching the second cavity (200) and heat generated in the second cavity (200) from reaching the first cavity (100).

The thermally insulating layer (40) is adapted to at least partially shield electromagnetic radiation generated in the first cavity (100) to prevent the electromagnetic radiation from reaching the second cavity (200) and/or at least partially shield electromagnetic radiation generated in the second cavity (200) so as to prevent the electromagnetic radiation from reaching the first cavity (100).

As the thermally insulating layer (40) is made conductive, the layer (40) increases the shielding of the second control unit (60) that is encased by the housing (10, 11), which is conductive and additionally may be connected to a ground element, and by the thermally insulating layer (40) which is made also conductive and additionally may be connected to a ground element. Therefore, a Faraday cage is formed.

In the shown embodiment, the first control unit (22) is arranged between the display (21) and the thermally insulating layer (40). Additionally, the thermally insulating layer (40) is configured to contact the housing (10, 11).

In the shown embodiment, the thermally insulating layer (40) comprises two opposing faces and the electrically conductive material (42) of the thermally insulating layer (40) is an electrically conductive coating applied on at least one face of the thermally insulating layer (40). In the shown embodiment, the coating is disposed the two faces of the thermally insulating layer (40).

Preferably, the coating may have a thickness between 4 micrometers and 15 micrometers, preferably 12 micrometers. If the thermally insulating layer (40) is thicker, the layer (40) becomes more rigid and problems to fit/locate/place the thermally insulating layer (40) may appear. If the coating is thinner than 4 micrometers, then the electrical contact is not ensuring, and so EMC problems may appear.

The thermally insulating layer (40) may have an overall thickness between 0.5 mm and 4 mm, preferably of 1.2 mm for plastic injection issues. The thermal insulation layer (40) may have protuberances or ribs that help dissipate the heat, in these parts the thickness can reach 2 mm. For instance, if the coating has a thickness of 0.1 mm and the insulating layer (40) of 1 mm, the relationship between both thicknesses is of 10. Thus, the relationship between both thicknesses is between 0.5 and 40.

In the shown embodiment, the thermally insulating layer (40) is made of plastic material. The electrically conductive material is a metallic material. For instance, aluminum.

The display panel (20) comprises a metallic layer (24) located between the display (21) and the first control unit (22). Additionally, the metallic layer (24) is larger than the first control unit (22) so as to shield the first control unit (22) from the display (21).

Additionally, the display assembly comprises a ground element being a part of or attached to the housing (10, 11).

The electrically conductive material (42) of the thermally insulating layer (40) is electrically connected to the second control unit (60), for instance, by the coating contacting the second control unit (60).

Additionally, the housing (10, 11) is configured for being electrically connected to the thermally insulation layer (40) and to the display (21).

The housing (10, 11) of the embodiment of FIGS. 2 to 5 comprises two parts (10, 11), a first part (10) and a second part (11). The second part (11) being joined and in electrical contact with the first part (10). The first part (10) of the housing is connected to the thermally insulating layer (40), specifically, they are in contact.

The first part (10) of the housing is connected to the thermally insulating layer (40) and the second part (11) of the housing being connected to the second control unit (60).

Additionally, the thermally insulating layer (40) is connected to the first part (10) of the housing through at least a metallic fixing mechanism (49). The metallic fixing mechanism (49) may be a set of screws.

In the shown embodiment, the thermally insulating layer (40) is in contact with the display panel (20). As previously stated, the display panel (20) may comprise a metallic layer (24), preferably made of a metallic material, for instance, copper, located between the display (21) and the first control unit (22) and in contact with both (21, 22). The first control unit (22) contacts the display (21) through the metallic layer (24) located between the first control unit (22) and the display (21). The display (21) is in contact with the housing (10, 11) through the thermally insulating layer (40) that has been made conductive. Thus, the display (21) is in contact with the housing (10, 11) and thus with the ground element. In an embodiment, the first part (10) of the housing is the ground element.

Preferably, the metallic layer (24) extends/covers the entire first control unit (22). The metallic layer (24) acts as heat dissipator for dissipating the heat emanating from the display (21) and from the first control unit (22).

By this way, a Faraday cage is formed that encases both PCBs (22, 60), the first control unit (22) is surrounded by the display (21) and by the thermally insulating layer (40) which are conductive. The second control unit (60) is surrounded by the thermally insulating layer (40) and the housing (10, 11) that are also conductive. Additionally, proper grounding has been included. The whole of the Faraday cage, including the interior elements has the same potential.

A Faraday cage is known to reduce the electromagnetic radiations coming out from an electronic assembly. A Faraday cage is an enclosure used to block electromagnetic fields. A Faraday cage may be formed by a continuous covering of conductive material or by a mesh of such materials. Additionally, for a Faraday cage to be effective, also proper grounding may be included which entails that the whole of the Faraday cage, including the interior elements, has to be at the same potential.

Additionally, as the thermally insulating layer (40) is conductive, the layer (40) allows the second control unit (60) to be electrically connected to the ground element, thus having the same potential than the first control unit (22), the display (21) and the housing (10, 11) that are electrically connected to the ground element. In this way the grounding of the Faraday cage is also improved due to the thermally insulating layer (40) and thus the Faraday cage is further improved.

The first part (10) of the housing further comprises an electrically conductive connection (30) electrically connecting the conductive layer (24) of the display panel (20) and the first part (10) of the housing. The first electrically conductive connection (30) is an elastic material such as a foam surrounded by electrically conductive material. The foam includes a conductive cover shroud.

In the shown embodiment, the first (22) and second (60) ECUs are located one after the other with respect to the display (21). Specifically, the first control unit (22) is located between the display panel (20) and the second control unit (60). Alternatively, both control units (22, 60) may be located next to each other in a plane parallel to the display panel (20) or even the first control unit (22) may be located in line with the display (21).

The thermally insulating layer (40) is also connected to the second control unit (60) through at least a first metallic fixing mechanism (61) such as screws, etc.

It has to be taken into account that when a housing (10, 11) is formed by two or more parts, a gap between the different parts exists. The gap allows the electromagnetic fields to escape the Faraday cage, thus, its cancelling effect being decreased.

Figure 2A:
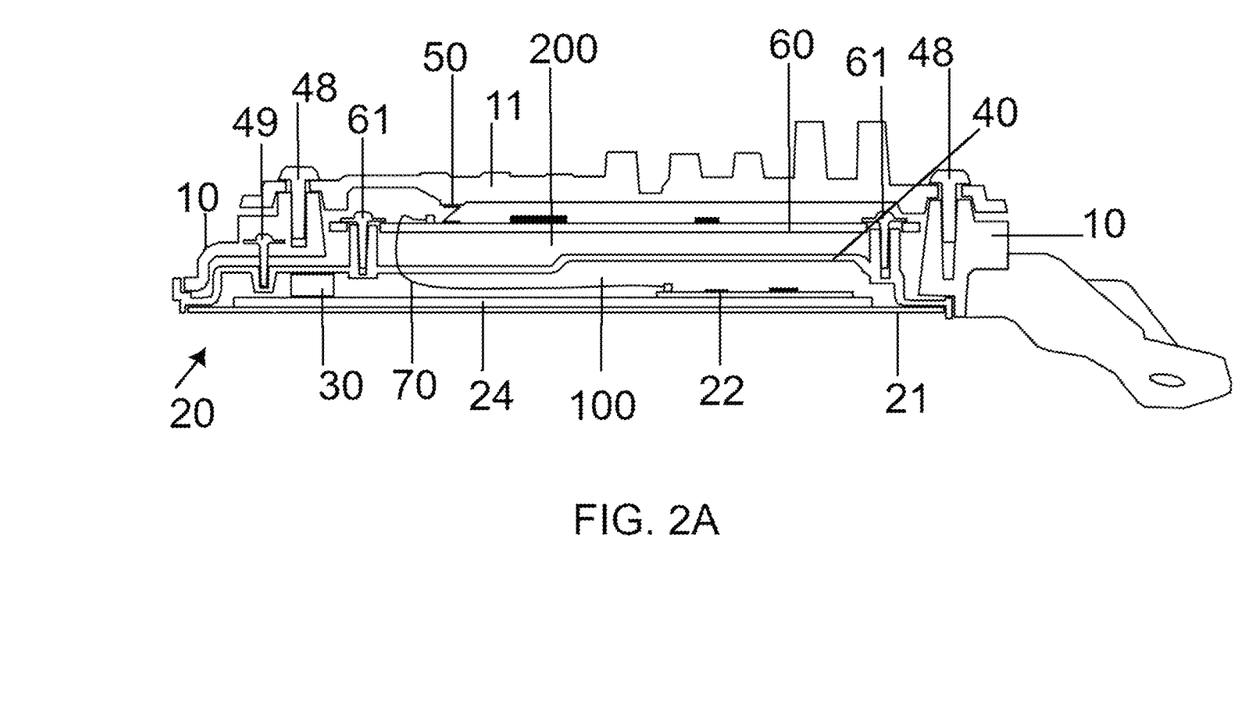
FIGS. 2A and 2B show cross-sections of an embodiment of a display assembly.
Figure 2B:
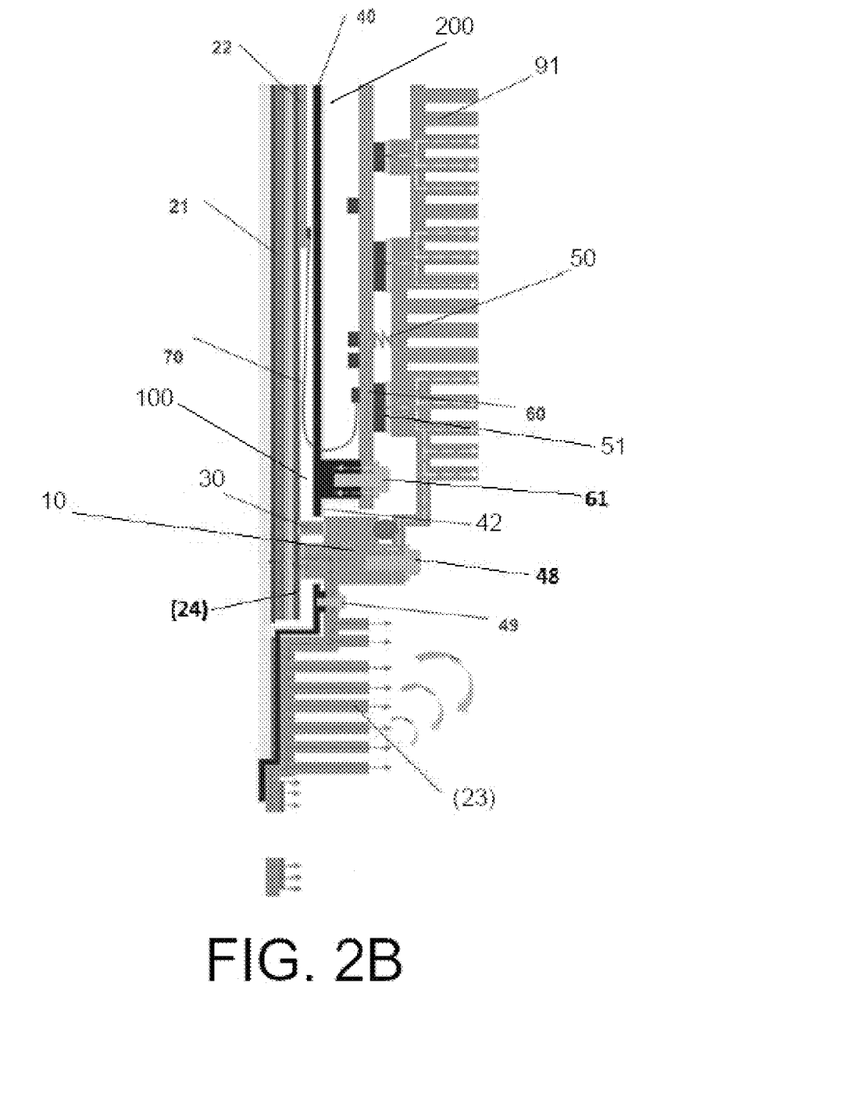
Figure 3:
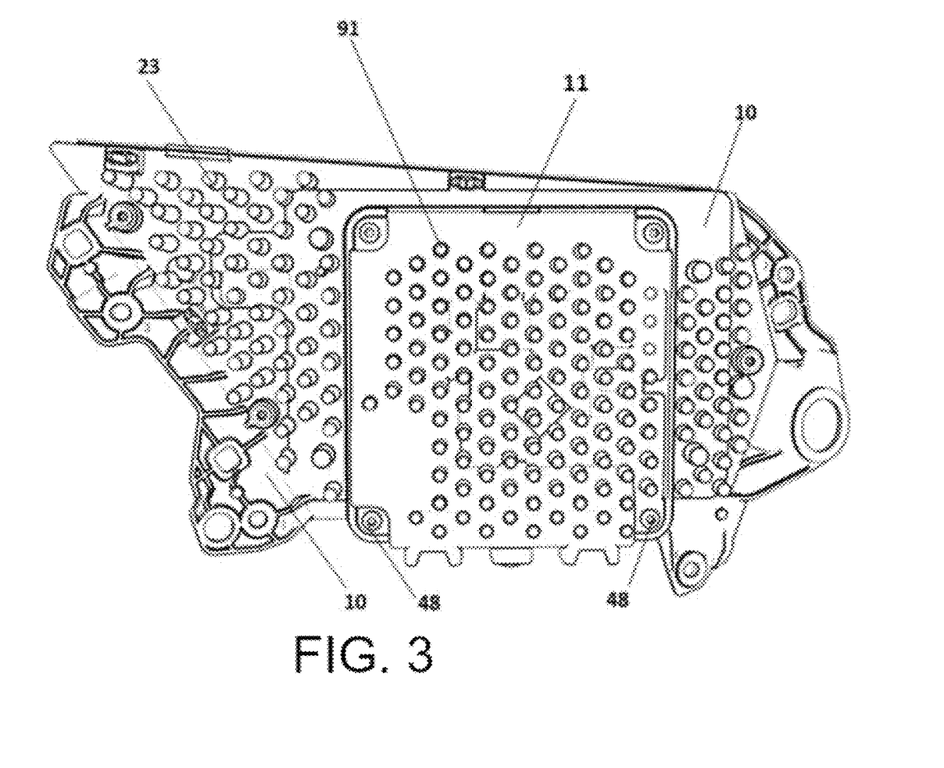
FIG. 3 shows a rear view of an embodiment of a display assembly housing.
Figure 4:
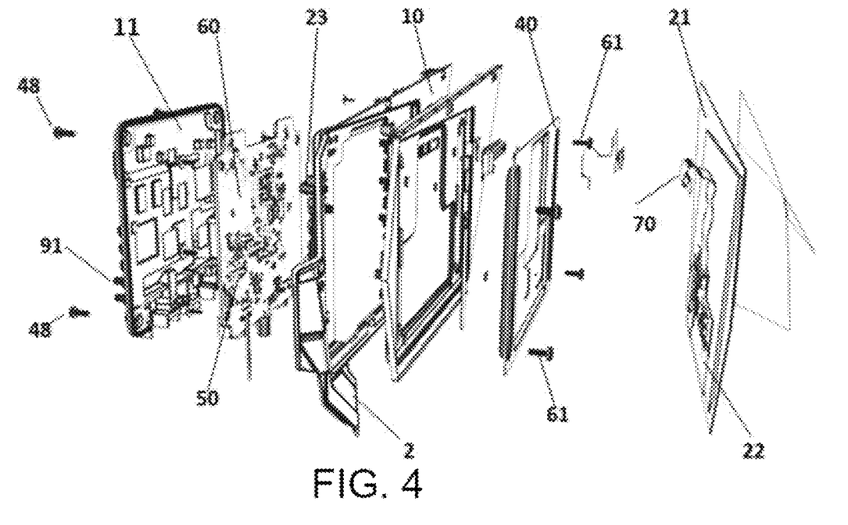
FIG. 4 shows an exploded view of an embodiment of the display assembly.

FIG. 3 discloses a rear view of the embodiment of the display assembly in FIG. 2. The rear part of the first part (10) of the housing and its heat dissipators (23) and the second part (11) of the housing and its heat dissipators (91).

In the shown embodiment, the connection between the first part (10) of the housing and the second part (11) of the housing is made through at least a metallic fixing device (48) such as screws, etc. Specifically, as stated in FIG. 3, four metallic fixing devices (48) are employed. For instance, four screws. This is a weak electrical connection that is not relevant for avoiding electromagnetic issues. The greater number of screws, the better electrical connection is performed, but to the contrary, more difficult is to assembly the device.

As the disclosed embodiment makes the thermally insulating layer (40) conductive, an alternative path of the electrical current is achieved, so the grounding of the second part (11) of the housing is improved. Additionally to the electrical connection to the first part (10) of the housing through the metallic fixing device (48), the second part (11) of the housing is also electrically connected to the second control unit (60) and in turn to the thermally insulating layer (40) and in turn to the first part (10) of the housing. As the thermally insulating layer (40) contacts the first part (10) of the housing, the electric current that reaches the first part (10) is increased. Therefore, the Faraday cage is improved thanks to the additional path without the need to increase the number of fastening device (48) between the first (10) and the second part (21) of the housing.

The second control unit (60) is connected to the second part (11) of the housing through at least a metallic spring (50). The metallic spring (50) is adapted to be deformed elastically to take different geometric tolerances and is electrically conductive.

In the shown embodiment, the first control unit (22) and the second control unit (60) are connected by a flex-connector (70) adapted to transmit data.

Therefore, the first and second cavities (100, 200) hold electronic components that are configured to exchange electronic data, being both cavities (100, 200) at least partially insulated from electromagnetic radiation (i.e., EMI) and heat radiation. The thermally insulating layer (40) further comprises an opening (not shown) so as to allow the flex-connector (70) to pass through. A heat insulating member such as a rubber gasket (not shown) may be fitted at the opening to at least partially prevent exchange of heat from the first cavity (100) to the second cavity (200) and/or from the second cavity (200) to the first cavity (100) through the opening. The heat insulating member may be made of an elastic and non-thermally conductive material adapted to be deformed when the flex-connector (70) goes through the opening, in use, electrically connecting the first and second control unit (22, 60) to allow transmitting electronic data from the first control unit (22) to the second control unit (60) and/or from the second control unit (60) to the first control unit (22).

Additionally, a thermally conductive material (51) such as a commercially available gap filler is a non-electrically conductive material having a thermal conductivity of, for example, 3-5 W/mK. The thermally and non-electrically conductive material (51) may contact at least one electronic component of the second control unit (60) and the second part (11) of the housing, such that, in use, the material (51) leads the heat generated from the second control unit (60) to be dissipated through the second part (11) of the housing, in particular, through the heat dissipaters (91). A preferred thermally conductive material (51) is one that dissipates heat generated by the electronics components at least 10 times faster than air, preferably 40 times faster than air. In addition, stable properties at temperatures ranging from −20° C. to 150° C. for the material of the insulating member are also preferred. Hardness and strength of the material from which the insulating member is made are not degraded over time.

The second housing part (11) comprises a heat dissipater (91), preferably comprises a plurality of protrusions, more preferably the protrusions arranged substantially perpendicular to the second control unit (60). The first housing part (10) comprises a first heat dissipator (23). Therefore, heat generated in the first cavity (100), for example, by the first control unit (22) and/or by the display (21) is not transferred to the second cavity (200) due to the thermally insulating layer; instead, the heat is dissipated out of the display assembly through the first heat dissipater (23). Similarly, heat generated in the second cavity (200), for example, by the second control unit (60) is not transferred to the first cavity (100) due to the thermally insulating layer; instead, the heat is dissipated out of the display assembly through the second heat dissipater (91). As explained above, the thermally and non-electrically conductive material (51) located in the second cavity (200) is adapted to contact one or more electronic components of the second control unit (60) and the inner surface of the back housing (11). Thus, the thermally and non-electrically conductive material (51) allows heat in the second cavity (200) to be dissipated through the second heat dissipater (91).

According to the above, the imaging device comprises a camera monitoring system (CMS) configured to be arranged on a lateral side of a vehicle and configured to capture an image of the adjacent rear zone of the vehicle. The second control unit (60) is configured to be connected to the camera monitoring system (CMS) for processing the image captured by the camera monitoring system (CMS) and generating a display image portion, the display panel (20) being configured to receive and display the image portion. The camera is pointing out backwardly. Thus, the display panel (20) is configured to display a video signal from the camera so that the display panel shows in real time (i.e., with very little delay) what is being captured by the camera. The video signal may operate at least at thirty frames per second (30 frs/s), in particular, at sixty frames per second (60 frs/s).

Thus, a motor vehicle may comprise:
two camera monitoring systems (CMSs),
a winglet (i.e., support element/camera mounting assembly), and the display assembly according to any of the above embodiments.

A first CMS may be located on the driver's zone and a second CMS may be arranged on the co-driver's zone. The first and second CMS are mounted to the winglet, wherein both cameras are configured to capture an image that encompasses at least a portion of the exterior lateral side of the vehicle. The display assembly may be arranged inside the vehicle (in-cabin), and performs operations of image processing by the control unit (60) which are based on the captured images. The claimed display assembly is further configured to display a video signal preferably at least at 60 frames per second.

The assembly procedure of the assembly device corresponding to the embodiment shown in the figures would comprise the following steps:

Joining with an adhesive the display panel (20) to the thermally insulating layer (40).

Clipping the thermally insulating layer (40) to the first part (10) of the housing. Other joining methods may be possible. The first part (10) of the housing comprises several foams with the conductive connection (30) that contact the copper layer (24).

Providing screws (49) for additionally joining the thermally insulating layer (40) to the first part (10) of the housing. This step would be optional.

Fixing the second control unit (60) to the thermally insulating layer (40) through screws (61). Specifically, four screws (61) are included, although the number is optional.

Providing a conductive foam to the second part (11) of the housing.

Joining the second part (11) of the housing to the first part (10) via, for example, four screws (48). Springs (50) are already provided in the second control unit (60).

Figure 5:
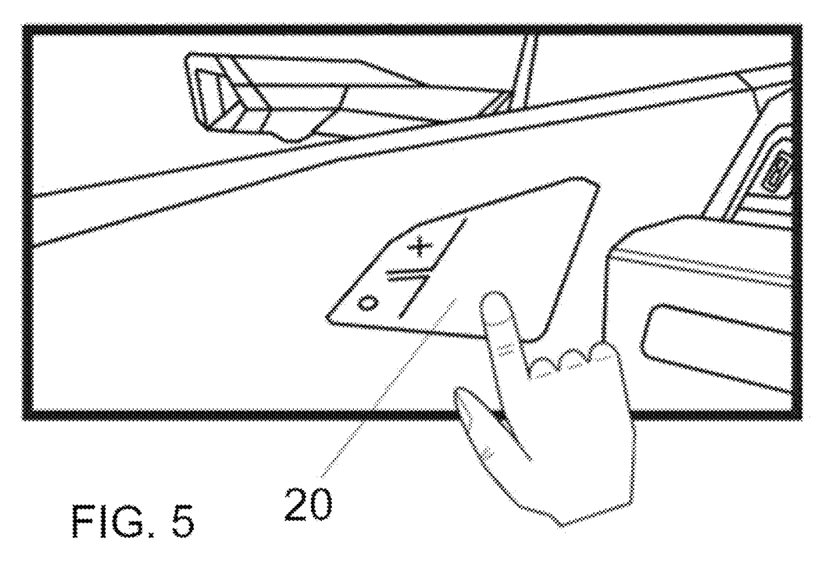
FIG. 5 shows a perspective view of an embodiment of the display assembly located on a vehicle door.

Providing the assembly to the vehicle door.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A display assembly for an imaging device, the display assembly comprising:
a display panel comprising:
a display,
a first control unit configured to control the display,
a second control unit connected to the first control unit for one of transmitting or receiving data to the second control unit,
a thermally insulating layer arranged between the first control unit and the second control unit, and
a housing configured for being electrically conductive and configured for partially encasing the display panel, the second control unit and the thermally insulating layer,
wherein the thermally insulating layer is configured to split the housing in at least a first cavity and a second cavity, the first cavity comprising the first control unit and the second cavity comprising the second control unit, the thermally insulating layer being adapted to prevent heat generated in the first cavity from reaching the second cavity and heat generated in the second cavity from reaching the first cavity, the thermally insulating layer comprising an electrically conductive material such that the thermally insulating layer is electrically conductive, the thermally insulating layer being adapted to at least one of: (i) at least partially shield electromagnetic radiation generated in the first cavity from reaching the second cavity; and (ii) at least partially shield electromagnetic radiation generated in the second cavity from reaching the first cavity.

2. The display assembly of claim 1, wherein the first control unit is arranged between the display and the thermally insulating layer.

3. The display assembly of claim 1, wherein the thermally insulating layer is configured to contact the housing.

4. The display assembly of claim 1, wherein the thermally insulating layer comprises two opposing faces and the electrically conductive material of the thermally insulating layer is an electrically conductive coating applied on at least one face of the thermally insulating layer.

5. The display assembly of claim 4, wherein the electrically conductive coating is made of a metallic material and has a thickness between 4 micrometers and 15 micrometers.

6. The display assembly of claim 4, wherein a thickness ratio of the electrically conductive material is 12 micrometers.

7. The display assembly of claim 1, wherein the thermally insulating layer is made of plastic material and has a thickness between 0.5 mm and 4 mm.

8. The display assembly of claim 1, wherein the display panel comprises a metallic layer located between the display and the first control unit, the metallic layer being larger than the first control unit to shield the first control unit from the display.

9. The display assembly of claim 1 further comprising a ground element being a part of or being attached to the housing.

10. The display assembly of claim 9, wherein the thermally insulating layer is at least electrically connected to the second control unit and the housing is configured for being electrically connected to the thermally insulation layer and to the display.

11. The display assembly of claim 10, wherein the electrically conductive material of the thermally insulating layer is electrically connected to the second control unit.

12. The display assembly of claim 1, wherein the thermally insulating layer is in contact with the display panel.

13. The display assembly of claim 1, wherein the housing comprises a first part and a second part, the second part being joined and in electrical contact with the first part, the first part being electrically connected to the thermally insulating layer and the second part being electrically connected to the second control unit.

14. The display assembly of claim 13, wherein the first part of the housing is a ground element.

15. The display assembly of claim 1 further comprising a flex-connector connecting the first control unit and the second control unit to transmit data therebetween, and wherein the thermally insulating layer comprises an opening to allow the flex-connector to pass through, and wherein the thermally insulating layer further comprises a heat insulating member fitted at the opening to at least partially prevent an exchange of heat from at least one of the first cavity to the second cavity or the second cavity to the first cavity through the opening.

16. A display assembly for an imaging device, the display assembly comprising:
a display panel including:
a display,
a first control unit configured to control the display,
a second control unit connected to the first control unit for one of transmitting or receiving data to the second control unit,
a thermally insulating layer arranged between the first control unit and the second control unit, and
a housing being electrically conductive and partially encasing the display panel, the second control unit, and the thermally insulating layer,
wherein the thermally insulating layer divides the housing in at least a first cavity and a second cavity, the first cavity including the first control unit and the second cavity including the second control unit, the thermally insulating layer being adapted to prevent heat generated in the first cavity from reaching the second cavity and heat generated in the second cavity from reaching the first cavity, the thermally insulating layer being adapted to at least one of: (i) at least partially shield electromagnetic radiation generated in the first cavity from reaching the second cavity; and (ii) at least partially shield electromagnetic radiation generated in the second cavity from reaching the first cavity.

17. The display assembly of claim 16, wherein the first control unit is arranged between the display and the thermally insulating layer.

18. The display assembly of claim 16, wherein the thermally insulating layer is configured to contact the housing.

19. The display assembly of claim 16 further comprising a flex-connector connecting the first control unit and the second control unit to transmit data therebetween, and wherein the thermally insulating layer comprises an opening to allow the flex-connector to pass through, and wherein the thermally insulating layer further comprises a heat insulating member fitted at the opening to at least partially prevent an exchange of heat from at least one of the first cavity to the second cavity or the second cavity to the first cavity through the opening.

20. A display assembly for an imaging device, the display assembly comprising:
a display panel including:
a display for displaying an image,
a first control unit configured to control the display,
a second control unit connected to the first control unit for one of transmitting or receiving data to the second control unit,
a thermally insulating layer arranged between the first control unit and the second control unit, and
a housing being electrically conductive and partially encasing the display panel, the second control unit, and the thermally insulating layer,
wherein the thermally insulating layer divides the housing in at least a first cavity and a second cavity, the first cavity including the first control unit and the second cavity including the second control unit, the thermally insulating layer being adapted to prevent heat generated in the first cavity from reaching the second cavity and heat generated in the second cavity from reaching the first cavity, the thermally insulating layer being adapted to at least one of: (i) at partially shield electromagnetic radiation generated in the first cavity from reaching the second cavity; and (ii) partially shield electromagnetic radiation generated in the second cavity from reaching the first cavity.

* * * * *